US006239025B1

United States Patent
Bease et al.

(12)

(10) Patent No.: US 6,239,025 B1
(45) Date of Patent: *May 29, 2001

(54) HIGH ASPECT RATIO CONTACT STRUCTURE FOR USE IN INTEGRATED CIRCUITS

(75) Inventors: Gordon Bease, Sunnyvale, CA (US); Philippe Gayet, Saint Vincent de Mercuze (FR)

(73) Assignee: SGS-Thomson Microelectronics S.A., Gentilly (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/947,126

(22) Filed: Oct. 8, 1997

(30) Foreign Application Priority Data

Oct. 8, 1996 (FR) .................................................. 96 12413

(51) Int. Cl.[7] ............................................. H01L 21/4763
(52) U.S. Cl. ......................... 438/637; 438/640; 438/673; 438/713
(58) Field of Search .................................. 438/396, 701, 438/713, 691, 692, 622, 625–626, 629, 633, 637–640, 667–668, 672, 673, 675

(56) References Cited

U.S. PATENT DOCUMENTS 5,091,768   2/1992   Yamazaki .
5,622,883 * 4/1997   Kim .................................... 438/396
5,635,423   6/1997   Huang et al. .

FOREIGN PATENT DOCUMENTS 0 488 628   6/1992   (EP) ........................... H01L/21/285
0 720 227   7/1996   (EP) ........................... H01L/23/485

OTHER PUBLICATIONS

French Search Report from French Application No. 96 12413, filed Oct. 8, 1996.

* cited by examiner

Primary Examiner—Chandra Chaudhari
Assistant Examiner—Thanh Nguyen
(74) Attorney, Agent, or Firm—Wolf, Greenfield & Sacks, P.C.; James H. Morris; Theodore E. Galanthay

(57) ABSTRACT

The invention provides an integrated circuit containing at least a portion of a first, horizontal, conductive or semiconductive layer covered by a first electrically insulating layer. A first conductive member is vertically provided through the first electrically insulating layer in electrical contact with the first, horizontal layer. The first conductive member includes a lower, substantially cylindrical portion, and an upper portion comprising an enlarged head. An upper surface of the upper portion is substantially coplanar with an upper surface of the first electrically insulating layer. A second electrically insulating layer is deposited over the upper surface of the upper portion of the first conductive member and the upper surface of the first electrically insulating layer. A second conductive member is provided through the second electrically insulating layer.

15 Claims, 6 Drawing Sheets

HIGH ASPECT RATIO CONTACT STRUCTURE FOR USE IN INTEGRATED CIRCUITS

BACKGROUND OF THE INVENTION

1. Field of the Invention

The invention relates to interconnect patterns made within high density integrated circuits. More particularly, it relates to methods and structures for forming such interconnect patterns in parallel planes.

2. Discussion of the Related Art

In current integrated circuit manufacture, there is a constant effort to create smaller and more dense circuit structures. In such dense circuit structures, it is essential to provide multiple levels of interconnect. It is commonly the practice to form a series of parallel planes of conductive material, and to make connections between those parallel planes with plugged contacts.

Integrated circuits are often operated at very high clocking speeds. Speeds of tens or hundreds of megahertz are common. The maximum attainable operating speed of a particular circuit is largely determined by the parasitic capacitance contained within its structure.

In order to reduce parasitic capacitance between the multiple levels of interconnection, there is a need to keep the parallel planes of conductive material well spaced apart. This means that thick layers of insulating material are used between the parallel planes of conductive material, and that the plugged contacts have to be deep.

The drive for increased circuit density dictates that such plugged contacts have as small a diameter (or width) as possible. Plugged contact structures are therefore required with a very high aspect ratio (height/diameter or height/width). The maximum attainable aspect ratio depends on the performance of the etch machine used to etch contact holes, and on the method used to later fill the contact holes with a conductive material. Contact holes can currently be reliably produced with aspect ratios of 4 to 5.

The minimum attainable diameter of plugged contacts depends largely on the maximum possible aspect ratio, rather than an absolute value of plugged contact diameter. Thus, it is possible to make a plugged contact of narrower diameter in a thin dielectric layer than in a thick dielectric layer. Determination of an aspect ratio of a contact hole must also take into account the thickness of any photosensitive masking layer used to define the locations in which contact holes are to be etched. In some instances, the thickness of the masking layer may be similar to the thickness of the underlying dielectric layer. Thus, if the maximum aspect ratio of the contact hole etch is 5, the final aspect ratio of the contact in the dielectric may be closer to 2.5.

As the contacts have a limited maximum aspect ratio, the joint goals of reducing parasitic capacitance by increasing dielectric layer thickness, and increasing circuit density by reducing contact diameter, are incompatible.

Contacts having high aspect ratio may be achieved using a two-step method. A first dielectric layer is etched to form contact holes, which are then filled with conductive material according to an appropriate process, to form a first layer of contacts. A second dielectric layer is then formed over the first dielectric layer and the first layer of contacts. This second dielectric layer is etched with the same pattern as the first dielectric layer. A second layer of contact holes is formed, and filled with conductive material according to an appropriate process, to form a second layer of contacts.

The overall effect of this is to double the effective maximum aspect ratio. In turn, this either allows a doubling of the spacing between subsequent parallel planes of conductive material, so reducing the parasitic capacitance; or a halving of the minimum contact diameter. Compromises may of course be used which increase the spacing between subsequent parallel planes and reduce the minimum contact diameter.

FIGS. 1 to 3 show variants of this prior art, in order to emphasize their respective drawbacks.

FIG. 1 shows a prior art structure 2 as described above. A substrate 4 contains circuitry 6 such as a MOS transistor 8. A polysilicon line 9 is shown over a field isolation region 10. Spacers 11 may or may not be present, adjacent to the polysilicon line 9 and the gate of transistor 8. A first dielectric layer 12 is shown, including first contacts 13. Above the first dielectric layer is a second dielectric layer 16, containing second contacts 18. Each second contact is substantially aligned with a corresponding first contact. A first metallization layer is then formed over the entire resulting upper surface, and is photolithographically patterned to form interconnect wiring 20 extending in the plane of the drawing, and interconnect wiring 21 extending perpendicularly to the plane of the drawing. In each layer 13, 18 of contacts, the separation between adjacent contacts is governed by design rules, defined for a particular process. The minimum contact separation design rule may be determined by the possible resolution of the photolithography apparatus, or by the effectiveness of the etching apparatus used. The minimum separations are usually expressed in terms of pitch: the distance between two corresponding features on adjacent contacts with minimum separation. In FIG. 1, minimum design rule pitches are shown for first contact layer (d1) and for second contact layer (d2).

In two consecutive photolithographic steps, it is practically impossible to align the respective masks perfectly. For this reason, the second contacts 18 are slightly misaligned with respect to the first contacts 13. In the figure, second contacts 18 are slightly displaced to the right. When the second dielectric layer 16 is etched, any portion of the first dielectric layer 12 exposed due to the misalignment of the two contact layers 13, 18 is also etched. When the second contacts 18 are formed, protrusions 23 form into the first dielectric layer 12. If the etch of the second layer 16 continues long enough, the protrusions 23 will reach the underlying circuitry 6, 8, 9. This may cause voids, as the protrusion 21 is unlikely to fill entirely the hole so created. In addition, the design rules may be violated in that the minimum spacing between adjacent contacts, d3, is less than allowed by the design rules.

FIG. 2 shows a structure of the prior art which overcomes these problems. An intermediate metal layer is deposited over the first contact layer 13, and etched to remain only in small pads 30 overlying each of the first contacts 13. These pads 30 are larger than the first contacts 13, their dimensions being sufficient that any misalignment of the second contacts 18 will not cause the second contact cut etch to attack the first dielectric layer 12. The disadvantages of this structure are that an additional metal deposition, photolithography and etching sequence is introduced to form pads 30. The minimum separation between adjacent contacts may now be defined in terms of the minimum possible separation d4 of adjacent pads 30. Due to the formation of pads 30, the second dielectric layer 16 will be deposited with an uneven upper surface. A planarization step—either polishing, or deposition and etchback of a sacrificial layer—will be required, which adds steps to the process, and slows manufacturing.

FIG. 3 shows a structure which attempts to avoid the problems of the structure of FIG. 2. An etch stop layer, 34 selectively etchable with respect to the material of the second dielectric layer 16, is formed over the first dielectric layer 12, prior to the etching of the first contact 13 holes. When the second dielectric layer 16 is etched to form the second contact 18 layer, any misalignment between the first and second contact layers will not cause the first dielectric layer 12 to be etched, as the etch will stop at the etch stop layer 34. This structure presents the inconveniences of adding an extra layer 34 deposition, and any misalignment between corresponding second and first contacts 18, 13 will cause a reduced surface area and so an increased resistance at their interface 36. Also, current crowding and electromigration may be increased at that point.

In view of the foregoing, it is an object of the present invention to provide stacked contacts of narrow diameter through thick dielectric layers, without the risk of penetrating a lower dielectric layer during etch of a subsequent dielectric layer.

It is a further object of the present invention to provide a method of producing stacked contacts which does not require the addition of layers into the semiconductor device.

It is a further object of the present invention to provide a method of producing stacked contacts which does not require the addition of photolithographic steps.

SUMMARY OF THE INVENTION

Accordingly, the invention provides a integrated circuit containing at least a portion of a first, horizontal, conductive or semiconductive layer covered by a first electrically insulating layer and a first conductive member vertically through the first electrically insulating layer in electrical contact with the first, horizontal layer. The first conductive member includes a lower, substantially cylindrical portion, and an upper portion comprising an enlarged head. An upper surface of the upper portion is substantially coplanar with an upper surface of the first electrically insulating layer. A second electrically insulating layer is deposited over the upper surface of the upper portion of the first conductive member and the upper surface of the first electrically insulating layer and a second conductive member is provided through the second electrically insulating layer.

The second conductive member may be composed of a portion of a second, horizontal conductive layer in electrical contact with the upper surface of the upper portion of the first conductive member.

A lower extremity of the second conductive member may be in electrical contact over its entire cross section with the upper surface of the upper portion of the first conductive member.

The second conductive member may include a lower, substantially cylindrical portion, and an upper portion comprising an enlarged head. An upper surface of the upper portion of the second conductive member may be substantially coplanar with an upper surface of the second electrically insulating layer.

A method is also provided for making contact structures in an integrated circuit, comprising the steps of (a) providing at least a portion of a first horizontal conductive or semiconductive layer; (b) providing a first electrically insulating layer over the first horizontal conductive or semiconductive layer; (c) in a location chosen for the formation of a contact structure, isotropically etching the first electrically insulating layer in order to provide an excavation of a first diameter penetrating only an upper portion of the first electrically insulating layer, and anisotropically etching, concentrically with the excavation, a substantially vertical hole of a second diameter through the first electrically insulating layer to expose a part of the first horizontal conductive or semiconductive layer; the second diameter being inferior to the first diameter; (d) filling the contact hole with a conductive material in order to provide a first conductive member in electrical contact with the part of the first horizontal conductive or semiconductive layer, and having an upper surface substantially coplanar with an upper surface of the first electrically insulating layer; (e) applying a second electrically insulating layer over the upper surfaces of the first conductive member and the first electrically insulating layer; (g) anisotropically etching an opening through the second electrically insulating layer in order to expose a portion of the upper surface of the first conductive member; and (h) filling the opening through the second electrically insulating layer with a conductive material in order to form a second conductive member therein.

The opening may be a substantially vertical hole of a third diameter, inferior to the first diameter.

Step (c) may further comprise the following steps: applying a photosensitive material to the upper surface of the first electrically insulating layer; photolithographically defining at least one hole in the photosensitive material exposing a portion of the first electrically insulating layer in a location where the contact hole is to be formed; retaining the photosensitive material with its hole after the isotropically etching step for use in defining the substantially vertical hole during the anisotropically etching step; and removing the photosensitive material.

Step (d) may comprises the steps of: filling the contact hole including the excavation, and covering the adjacent upper surface of the first electrically insulating layer, with an electrically conductive material to a thickness sufficient to ensure that the excavation is filled to at least the level of the upper surface of the first electrically insulating layer; and applying a polishing step to remove the conductive material above the level of the adjacent upper surface of the first electrically insulating layer, to form upper surfaces of the first conductive members substantially coplanar with the adjacent upper surface of the first electrically insulating layer.

The method may further comprise, between steps e) and g), the step (f) isotropically etching the second electrically insulating layer in order to provide an excavation of a fourth diameter, penetrating only an upper portion of the second electrically isolating layer, the fourth diameter being superior to the third diameter.

The method may further comprise the step of providing a portion of a second horizontal electrically conductive layer in electrical contact with an upper surface of the second conductive member.

BRIEF DESCRIPTION OF THE DRAWINGS

A certain embodiment of the current invention will be described, by way of example, with reference to the accompanying diagrams, wherein.

In the figures, and as is customary in the field of integrated circuit manufacture, the vertical dimensions of certain features are exaggerated for clarity.

DETAILED DESCRIPTION

Figure 4A:
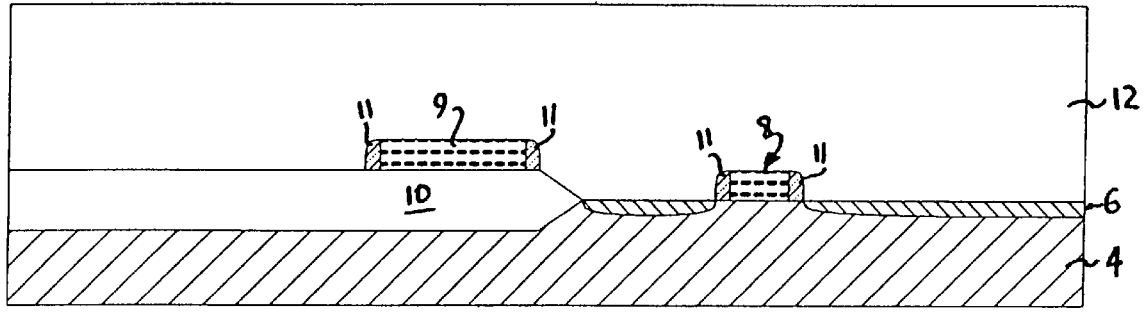
FIGS. 4A to 4H show stages in the fabrication of a portion of an integrated circuit including a contact structure of the current invention, between a first metallization layer and a semiconductor substrate.

FIG. 4A shows an early stage in the manufacture of a stacked contact structure of the present invention. Features common with earlier figures carry the same reference labels.

A transistor 8 and a polysilicon line 9 over a field isolation 10 are provided. Field isolation 10 may be a LOCOS oxide, or may be a trench oxide, buried within the substrate 4. Spacers 11 may or may not be provided adjacent to the polysilicon line 9 and the gate of transistor 8. A first dielectric layer 12 has been deposited over the surface of the structure, to a thickness approximately one half of the required final thickness of dielectric under the first level of interconnect wirings. The first dielectric layer 12 may be composed of a silicon dioxide based glass, such as TEOS, PSG, PSG, or others, deposited to a thickness of 800–1500 nm and planarized by a suitable techniques, such as chemical mechanical polishing, or the deposition and removal of a sacrificial layer.

Figure 4B:
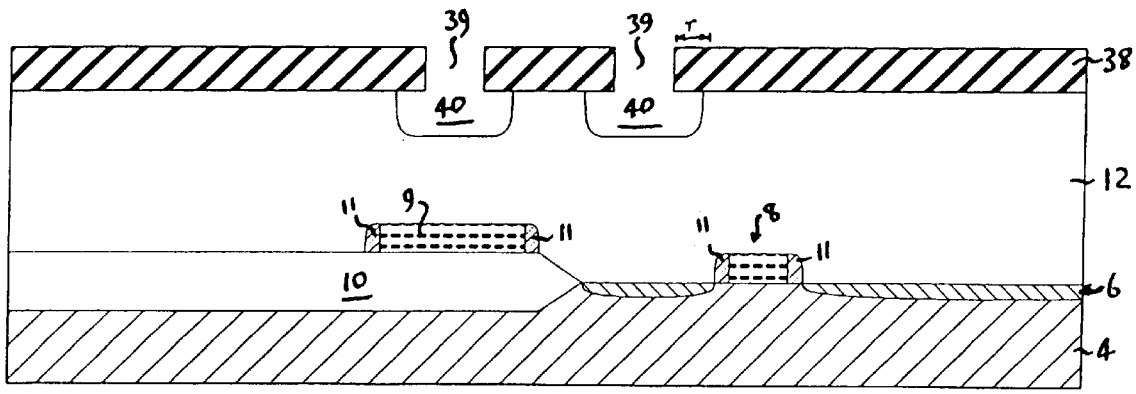

FIG. 4B shows the structure after being subjected to a 'contact head enlargement' etch, according to an aspect of the invention. A photolithographic step first defines a mask 38 of photosensitive material containing a hole 39 corresponding to the position of each required contact hole.

An isotropic etch is first applied, through the holes 39. If the dielectric layer is composed of a silicon oxide based glass material, the isotropic etch may be performed by plasma etching in a fluorine chemistry, such as by using an $NF_3$ plasma in a high pressure reactor. In such a reactor, the plasma and the structure to be etched are held at a same electrical potential. The plasma attacks the dielectric layer 12 by chemical attack, in an isotropic fashion to form an excavation 40, undercutting parts of the photosensitive material surrounding the hole 39. This contact head enlargement etch is continued for a predetermined duration of time suitable to etch excavations 40 of a required size. The size and aspect ratio of the excavations 40 produced may be controlled by varying the type and pressure of the plasma used. Such control modifies the horizontal and vertical etch rates. The excavations 40 may extend beyond the diameter of the holes 39 by about 0.15–0.3 pm, for example. This increase in diameter is equivalent to 2r, where r is the increase in radius of the excavation 40 compared to the holes 39.

Figure 4C:
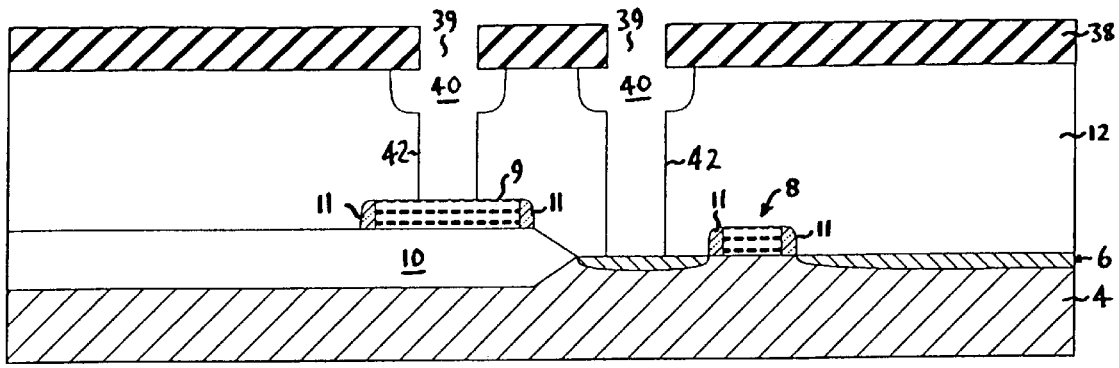

As illustrated in FIG. 4C, after the isotropic etch is completed, an anisotropic etch is applied through the same holes 39 of the mask 38 of photosensitive material as used for the isotropic etch to expose required parts of underlying components 9, 8.

A parallel-sided contact hole 42 is etched, concentrically with the excavation 40 through the entire remaining thickness of the first dielectric layer 12. This may be achieved by any suitable anisotropic contact etch. If the dielectric layer is composed of a silicon oxide based glass material, the anisotropic etch may be performed by plasma etching in a fluorine based chemistry. For example, a $CF_4$ or $CHF_3$ plasma may be used in a 'diode' reactor, where a high frequency, high voltage is applied between the structure being etched and the plasma. Such etching is largely due to the physical bombardment of the structure by the plasma ions. Etching is very directional. Other types of reactor, and other anisotropic etch methods may of course be used.

Figure 4D:
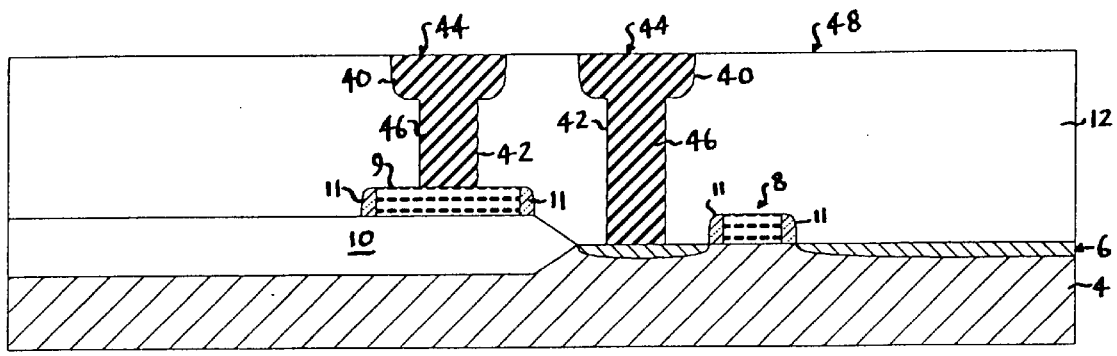

FIG. 4D shows the structure after the contact cuts 40, 42 have been filled with a conductive material. This may be achieved by any suitable known process, depending on the materials used for forming the contacts. A tungsten layer may be blanket deposited over all exposed surfaces, inside the contact holes 42, 40 and over the surface of dielectric layer 12 then etched back to leave conductive material only in the contact holes; a selective deposition of tungsten or other metal may be made to silicon exposed surfaces 9, 6 at the bottom of the contact holes 42, tungsten or other metal then being deposited only in the contact holes; liquid aluminum may be caused to flow into the contact holes, either with or without a previously deposited titanium or titanium nitride adhesion layer. A vapor deposited layer of polycrystalline silicon may be formed to fill the contacts. Many other known contact formation methods are suitable.

In any case, the conductive material must be deposited to a thickness sufficient to ensure that the excavations 40 are filled over their entire area to at least the level of the upper surface 48 of the first insulating layer 12. A chemical-mechanical polishing step, or a mechanical polishing step, is then applied to the resulting surface to remove the conductive material from the surface 48, and to produce contacts 46 with enlarged heads filling the excavations, the upper surfaces 44 of which are approximately coplanar with the upper surface 48 of the dielectric layer 12.

Figure 4E:
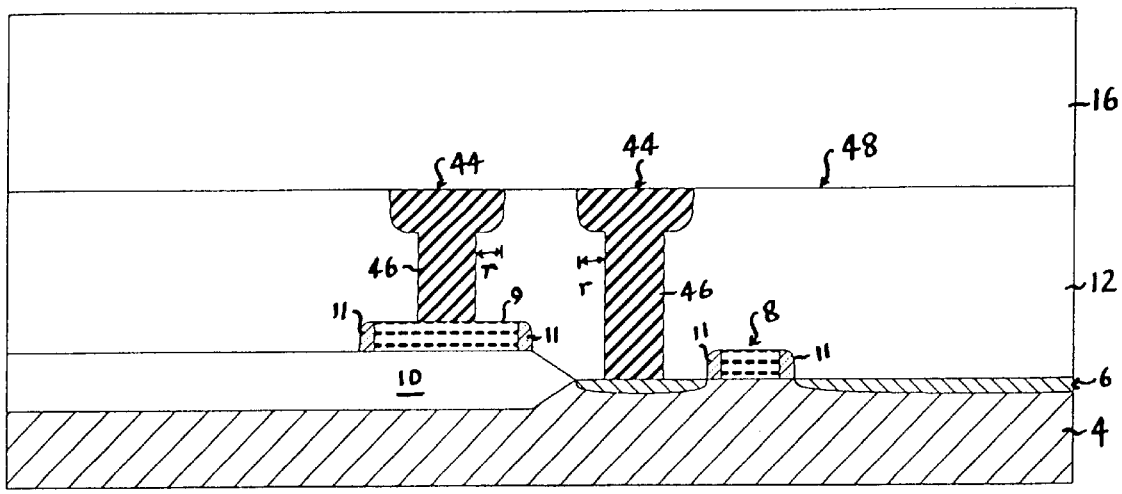

FIG. 4E shows the structure at a later stage in the manufacturing process. A second dielectric layer 16 has been deposited over the upper surfaces 48, 44 of the first dielectric layer 12 and the contacts 46. The total thickness of the two dielectric layers 16, 12 is the total thickness of dielectric required beneath the first layer of interconnect wirings to be formed later.

Figure 4F:
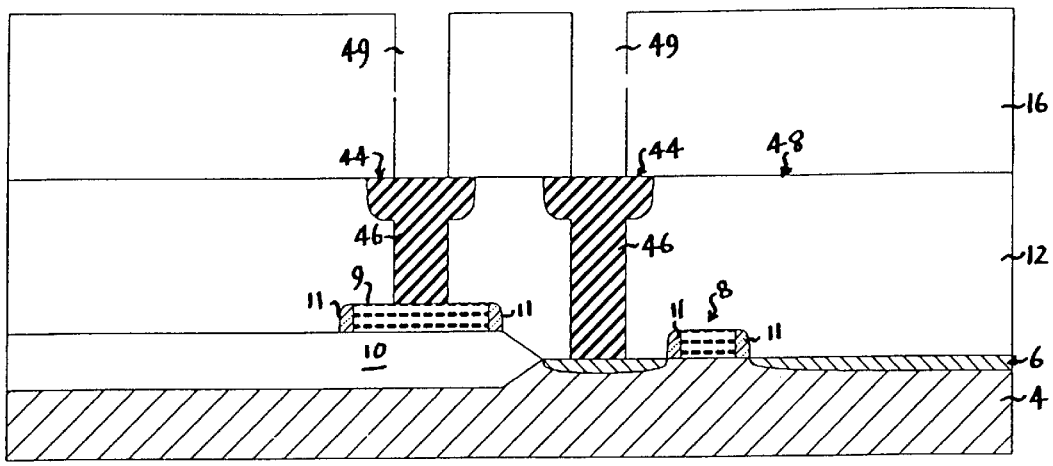

As shown in FIG. 4F, a standard, anisotropic etch is used to open second contact holes 49 in the second dielectric layer 16. Any suitable etch method can be used, provided that it is selective to the material of the contacts 46. For example, if the contacts 46 are in tungsten and the second dielectric layer 16 is in a silicon oxide based glass material, the etch used may be a fluorine based plasma etch performed in a 'diode' reactor, as described in reference to FIG. 4C, or any other suitable anisotropic etch.

Figure 4G:
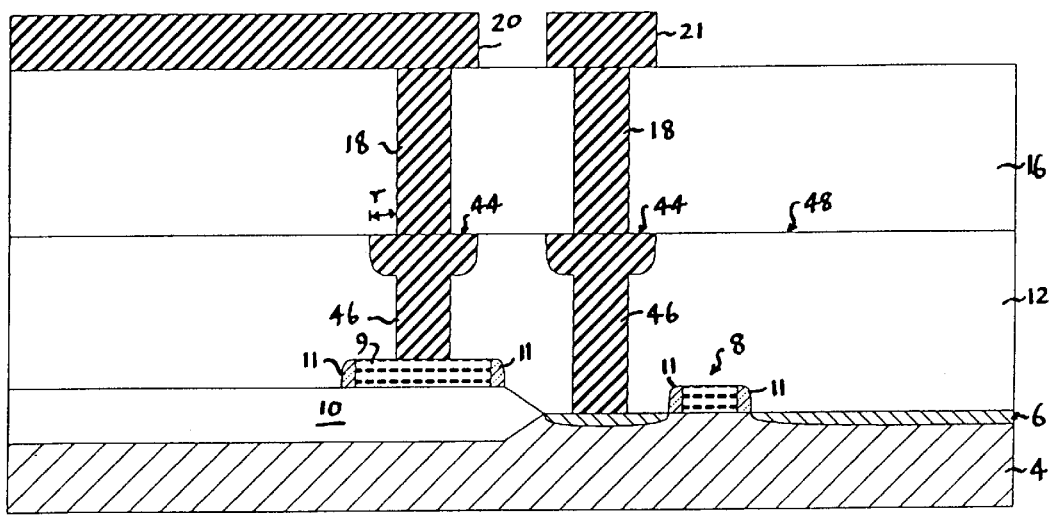

FIG. 4G shows the structure at a later stage of the process. The second contact holes 49 have been filled with a conductive material to form second contacts 18. As described for the first contacts, this operation may be realized by any of a number of possible methods, depending on the material required to be used for the second contacts 18. A tungsten layer may be blanket deposited over all exposed surfaces, inside the contact holes 49 and over the surface of dielectric layer 16 then etched back to leave conductive material 18 only in the contact holes; a selective deposition of tungsten or other metal may be made to exposed surface 44 at the bottom of the contact holes, tungsten or other metal then being deposited only in the contact cuts; liquid aluminum may be caused to flow into the contact cuts, either with or without a previously deposited titanium or titanium nitride adhesion layer. A vapor deposited layer of polycrystalline silicon may be formed to fill the contacts. Many other known contact formation methods are suitable.

Second contacts 18 are in electrical contact with corresponding first contacts 46 over the entire cross-sectional area of the second contacts. In the example shown in FIG. 4G, the second contacts 18 are perfectly aligned with corresponding first contacts 46.

As the first contacts 46 have enlarged heads, a certain misalignment of the second contacts 18 with respect to the first contacts is tolerable. The allowable misalignment error is equal to the difference r in radii between the second contact 18 and the surface 44 of the enlarged head of the first contact 46.

Figure 4H:
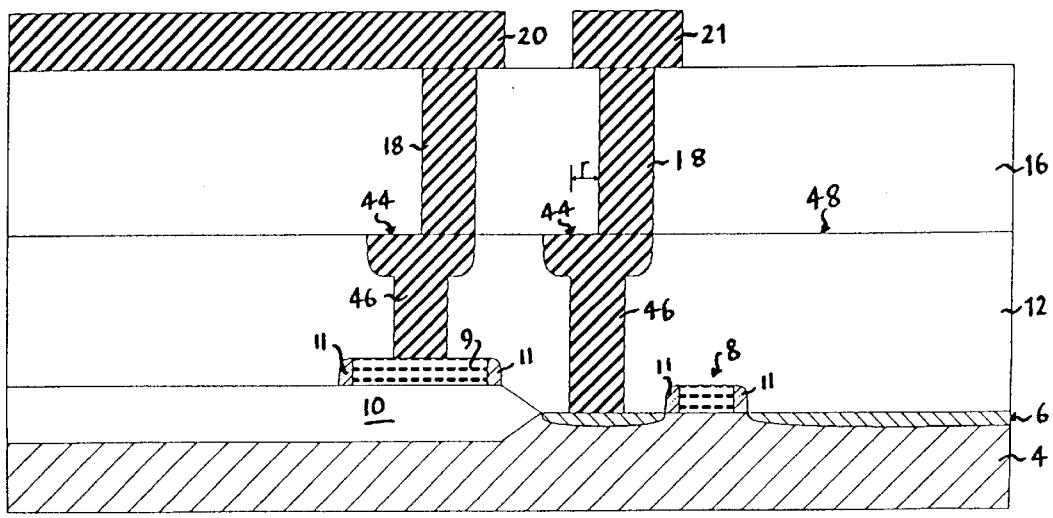

FIG. 4H shows a structure comparable to that of FIG. 4G, but with maximum allowable misalignment r between the first contacts 46 and the second contacts 18. This misalignment is significantly larger than that which would be allowable in a process where no enlarged heads of the first contacts were present. Second contacts 18 are in electrical contact with corresponding first contacts 46 over the entire cross-sectional area of the second contacts.

By suitably determining the etch time, chemistry and conditions for the isotropic etch applied to form the excavation 40 in FIG. 4B, the dimension r can be fixed to a value sufficient to cope with the maximum variation in mask alignment between the first and second contact layers.

By creating 'stacked' contacts 18, 46 according to the current invention, the effective aspect ratio of the overall contact may be increased, by approximately a factor of two. This improvement in aspect ratio may either mean that the dielectric layers 16, 12 lying under the first level of interconnect 20, 21 may be approximately twice as thick as the maximum possible in methods not using stacked contacts. Alternatively, if the total thickness of dielectrics 16, 12 is not increased, the diameter of the contacts 18, 46 formed may be approximately halved. In such a case, the dielectric etched at each etching step is thinner. Accordingly, the thickness of the photosensitive mask may be reduced, having the effect of maximizing the effective aspect ratio—the aspect ratio of the contact finally formed in the dielectric.

Figure 5:
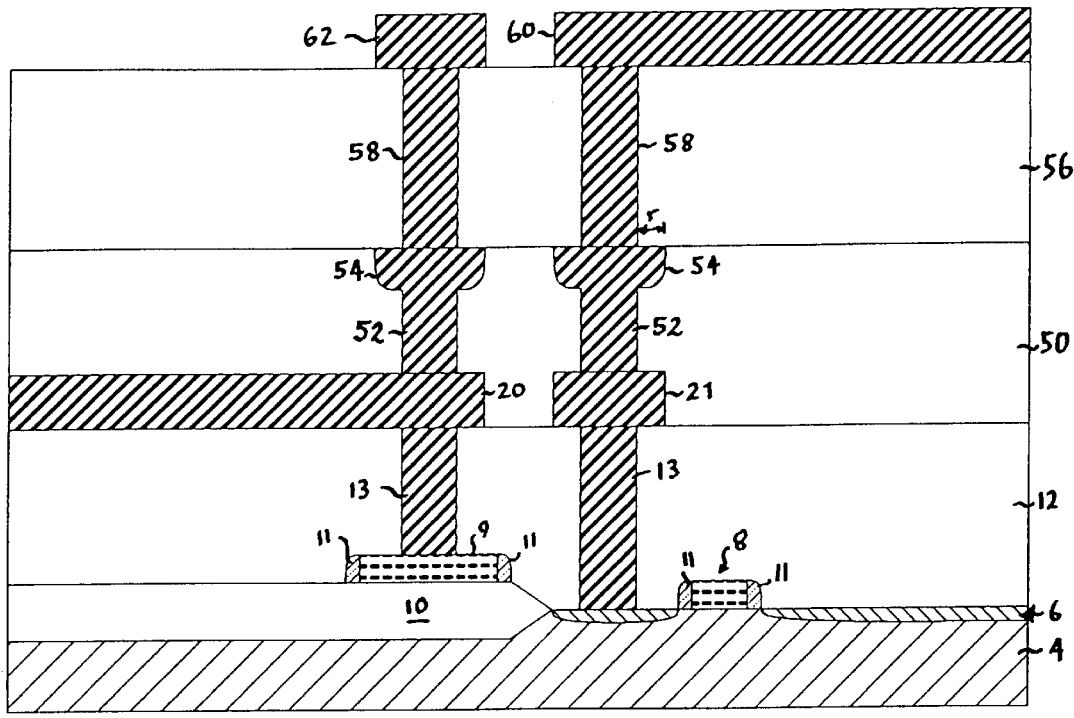
FIGS. 5–8 show a portions of integrated circuits each including a contact structure according to various embodiments of the current invention.

FIG. 5 shows a structure according to another embodiment of the invention. Instead of a stacked contact being formed in two dielectric layers below the first interconnect wiring layer, here a stacked contact layer is formed between two interconnect wiring layers.

A first dielectric layer 12 is present over the substrate 4 and the circuitry 6, 8, 9 present thereon. Standard, parallel sided contacts 13 have been formed therein. A first level of interconnect wiring 20, 21 has been formed on the first dielectric layer and first contacts 13. Above the first interconnect wiring layer, a first interlevel dielectric layer 50 has been formed. This may be achieved according to any suitable process, such as the deposition of silicon dioxide by the chemical reaction of silane $SiH_4$ with oxygen, or the deposition of TEOS, or other silicon oxide based glass materials, or the deposition of any other suitable dielectric material, followed by a planarizing process such as mechanical or chemical-mechanical polishing, or the deposition and etching of a sacrificial layer. First vias 52 with enlarged heads 54 are then formed in the first interlevel dielectric layer 50, according to the process described with reference to the first contacts 46 of FIGS. 4B to 4D.

A second interlevel dielectric layer 56 is then deposited, again by any suitable method. Second vias 58 are then formed through the second interlevel dielectric layer 56, according to any suitable via formation technique. A tungsten layer may be blanket deposited over all exposed surfaces, inside second via holes and over the surface of dielectric layer 56 then etched back to leave conductive material only in the contact cuts; a selective deposition of tungsten or other metal may be made to exposed surfaces of first vias 52, tungsten or other metal then being deposited only in the second via holes; liquid aluminum may be caused to flow into the second via holes, either with or without a previously deposited titanium or titanium nitride adhesion layer. A vapor deposited layer of polycrystalline silicon may be formed to fill the second via holes. A second layer of metallization is then deposited over the resulting surface, and photolithographically defined to form a second interconnection wiring layer, including a wiring 60 extending in the plane of the drawing, and a wiring 62 extending perpendicularly to the plane of the drawing.

This structure is useful in the case where the parasitic capacitance between two interconnect layers 20, 21; 60, 62 is of importance. An alignment tolerance of r is permitted between the first via 52 and the second via 58.

Figure 6:
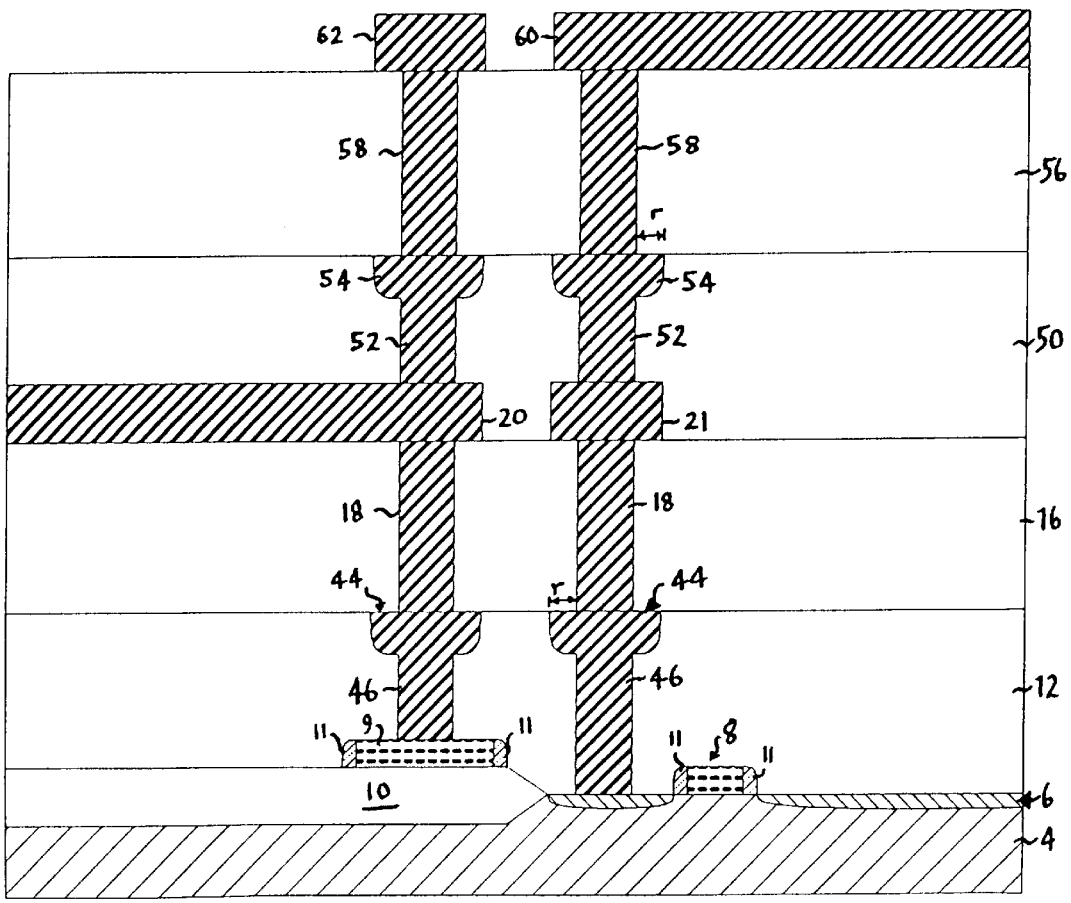

FIG. 6 shows a structure according to another embodiment of the invention. Here, the structures of FIGS. 4G and 5 are combined so as to provide a structure which benefits from the advantages of both of those embodiments. An alignment tolerance of r is allowed between the first contacts 46 and the second contacts 18, and between the first via 52 and the second via 58.

Figure 7:
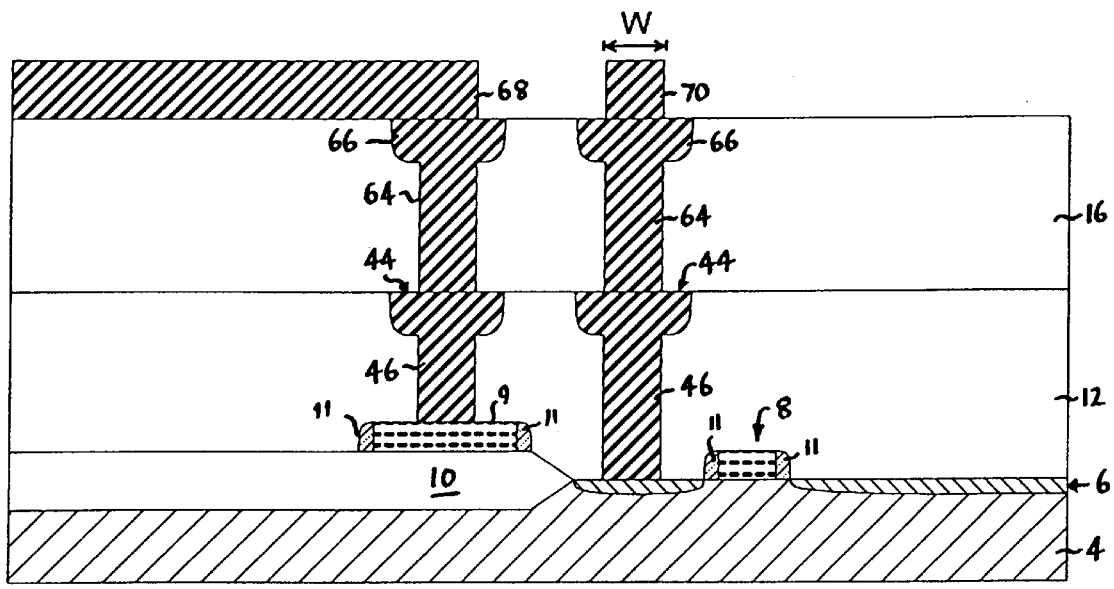

FIG. 7 shows another embodiment of the invention. Here, second contacts 64 are formed with enlarged heads 66. This allows interconnection wirings 68, 70 to be formed with a reduced dimension. Wiring 68 extends along the plane of the diagram while wiring 70 extends in a direction perpendicular to the plane of the drawing. By forming the interconnect wirings 68, 70 with a width W equal only to the dimension of the main, anisotropic, contact etch (42 in FIG. 4C), but providing an enlarged head 66 to ensure that the entire width W of the interconnect wiring 70 is in electrical contact with the second contact 64, the wiring width may be reduced, and the need for any enlarged regions in the interconnect wiring above the contact can be avoided.

If no wiring 70 were necessary in the design of the integrated circuit being produced, a via in an interlevel dielectric layer could be directly placed on the second contact 66, without the need for a metal pad in the wiring layer.

Figure 1:
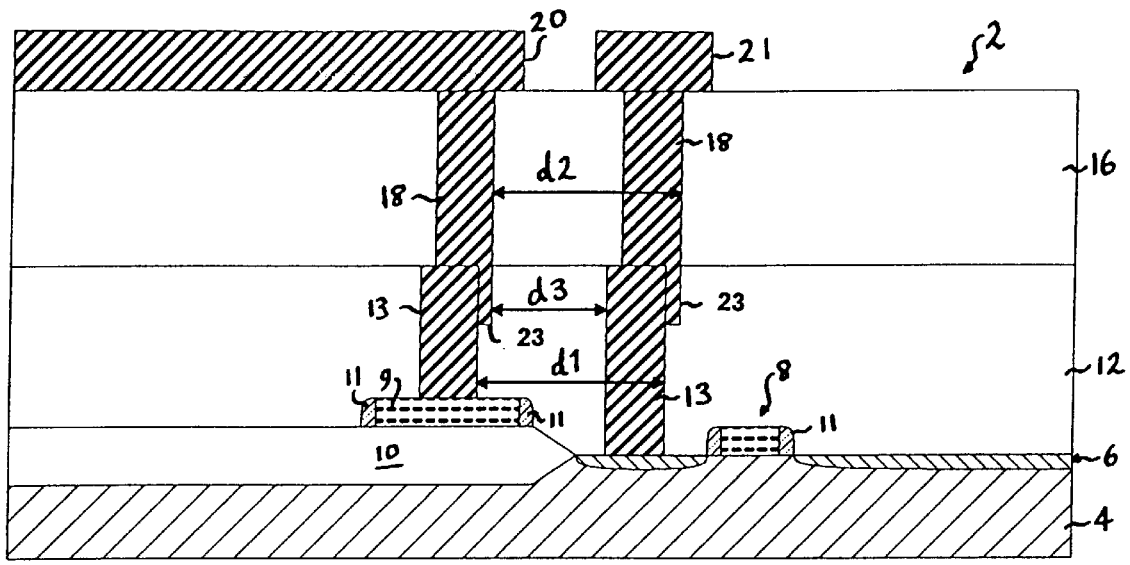
FIG. 1, already described, shows a stacked contact structure of the prior art.
Figure 2:
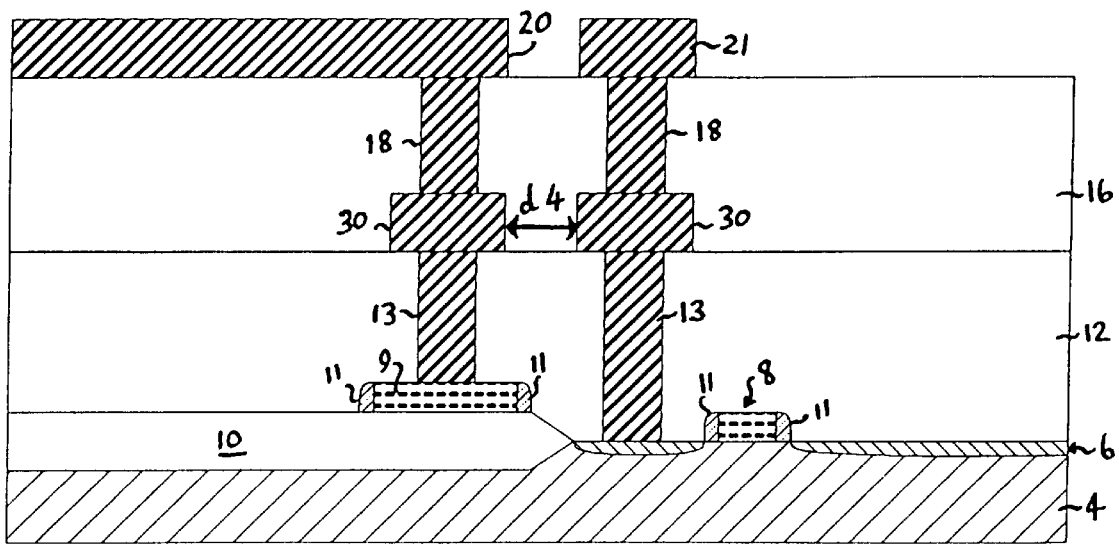
FIG. 2, already described, shows a stacked contact structure of the prior art.
Figure 8:
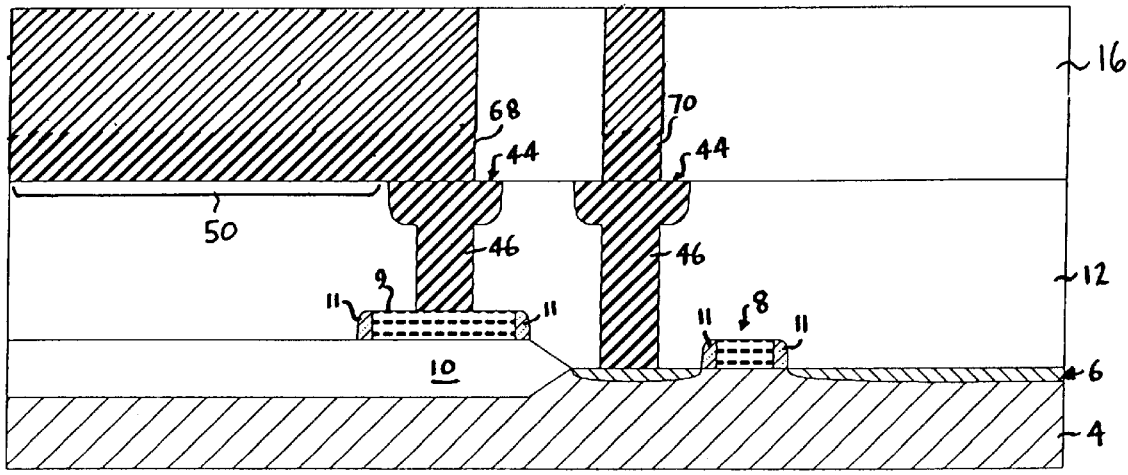

FIG. 8 shows another embodiment of the invention. Instead of forming a second layer of contacts through the second dielectric layer 16, a pattern of interconnect wirings 68, 70 as defined, in a single damascene process. As in FIG. 7, wiring 68 extends along the plane of the diagram while wiring 70 extends in a direction perpendicular to the plane of the drawing. Although there is a risk of overetching the first dielectric layer 12 in regions 50 where the damascene interconnect wiring 68 does not lie on the first contacts 46, the problem of the protrusions 23 of FIG. 1 does not exist. Protrusions 23 are undesirable as they are so small in diameter that they may remain unfilled, providing a reliability hazard. In the structure of FIG. 8, any etching into the first dielectric layer 12 will cover the entire length of region 50, and will be relatively easy to fill. Etching of the second dielectric layer must still be timed reasonably well, to avoid penetration of the first dielectric layer, or creating a damascene interconnect pattern too deep for subsequent tilling with a conductive material.

Figure 3:
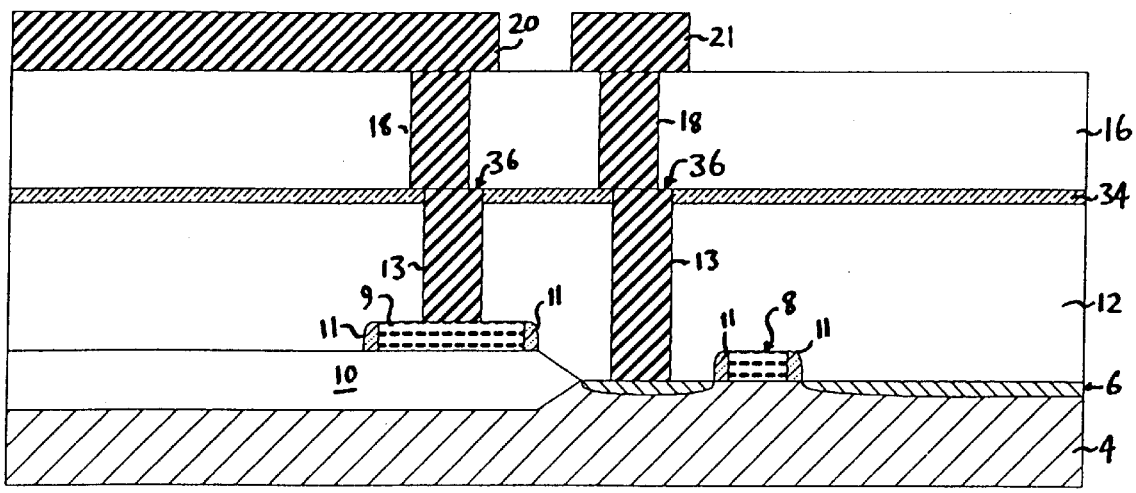
FIG. 3, already described, shows a stacked contact structure of the prior art.

To avoid the possibility of etching into the first dielectric layer 12, an etch stop layer such as that labeled 34 in FIG. 3 may be provided. The advantages of the present invention relating to the avoidance of current crowding or increased resistance due to misalignment of wirings 70, 68 to contacts 46, are maintained by the presence of enlarged upper surfaces 44 of contacts 46, in such a case.

As an example, a typical current set of design rules for the layers discussed here is:

Diameter of contact 13,46: 0.4 μm (although this depends on the aspect ratio of the contact cut)

Minimum separation between contacts 3, 46; 0.5 μm

Minimum width of interconnect wiring 21 of first metallization layer: 0.5 μm Minimum spacing between interconnect wirings 20 21, of the first metallization layer: 0.6 μm Minimum overlap of wirings onto underlying contact: 0.15 μm Minimum width of interconnect wiring 62 of second metallization layer: 0.7 μm Minimum spacing between interconnect wirings 20, 21 of the second metallization layer: 0 7 μm Minimum, overlap of wirings of second metallization layer onto underlying via: 0.15 m The maximum tolerance between masking levels permitted in this technology is therefore 0.15 μm evidenced by the dimension given for minimum metal to contact overlap. Therefore, the enlarged heads need to have a value of r, the increase in radius of the contact or via, of 0.15 μm. This would reduce the spacing between adjacent contacts at their upper extremity by 0.3 μm. This is not a problem. As the minimum, distance between metal lines is at least 0.6 μm, with an overlap of at least 0.15 μm each side, this means that the minimal spacing between unrelated contacts in a same layer is in reality 0.9 μm. The reduction of this dimension to 0.6 μm by the enlarged heads of the invention does not involve any electrical risk, since the minimum contact spacing of 0.5 μm is respected. While two minimally spaced contacts may be placed 0.5 μapart, and that dimension is reduced to 0.2 μby the enlarged heads of the invention, any two contacts placed so closely together are necessarily connected to a same wiring 20, 21; 68, 70 as their separation is es'than the minimum separation.

As the enlargement of the heads of the contacts 46, 64 is self-aligned to the contacts themselves, there is no need to build in an alignment tolerance for the formation of these enlarged heads.

In all embodiments of the invention, the enlarged heads 40, 44, 54 of contacts or vias are formed by a first isotropic etch through a photoresist 38 mask, to etch enlarged contact heads in the underlying dielectric layer to produce the required increase r in contact cut radius, then applying an isotropic etch through the same photoresist 38 mask for a time suitable to penetrate the remaining thickness of the underlying dielectric layer to expose required portions of the underlying circuitry.

Although the invention has been described with reference to a limited number of particular embodiments, numerous modifications and improvements be apparent to one skilled in the art, and fall within the scope of the present invention. In particular more than two dielectric layers may be used between the substrate and the first interconnect wiring layer, or between consecutive wiring layers. At least one, and preferably all but the last, of each such series of dielectric layers, will have contacts or vias with enlarged heads formed therein. Formation of enlarged heads in the final dielectric layer would have the advantages discussed with reference to FIGS. 7, 8.

Having thus described at least one illustrative embodiment of the invention, various alterations, modifications, and improvements will readily occur to those skilled in the art Such alterations, modifications, and improvements are intended to be within the spirit and scope of the invention.

Accordingly, the foregoing description is by way of example only and is not intended as limiting. The invention is limited only as defined in the following claims and the equivalents thereto.

What is claimed is:

1. A method for making contact structures in an integrated circuit comprising the steps of:

a) providing at least a portion of a first horizontal conductive or semiconductive layer;

b) providing a first electrically insulating layer over the first horizontal conductive or semiconductive layer;

c) in a location chosen for the formation of a contact structure:

isotropically etching the first electrically insulating layer in order to provide an excavation of a first diameter penetrating only an upper portion of the first electrically insulating layer; and anisotropically etching, concentrically with the excavation, a substantially vertical hole of a second diameter through the first electrically insulating layer to expose a part of the first horizontal conductive or semiconductive layer; the second diameter being inferior to the first diameter;

d) filling the contact hole with a conductive material in order to provide a first conductive member in electrical contact with the part of the first horizontal conductive or semiconductive layer, and having an upper surface substantially coplanar with an upper surface of the first electrically insulating layer;

e) applying a second electrically insulating layer over the upper surfaces of the first conductive member and the first electrically insulating layer;

g) anisotropically etching an opening through the second electrically insulating layer in order to expose a portion of the upper surface of the first conductive member;

h) filling the opening through the second electrically insulating layer with a conductive material in order to form a second conductive member therein; and i) providing a portion of a second horizontal electrically conductive layer in electrical contact with an upper surface of the second conductive member.

2. A method according to claim 1 wherein the opening is a substantially vertical hole of a third diameter, inferior to the first diameter.

3. A method according to claim 2, wherein step (h) comprises filling the opening with the conductive material to form the second conductive member and in which the second conductive member has an upper surface substantially coplanar with an upper surface of the second electrically insulating layer.

4. A method according to claim 3, further comprising, between steps e) and g), the step:

f) isotropically etching the second electrically insulating layer in order to provide an excavation of a fourth diameter, penetrating only an upper portion of the second electrically isolating layer, the fourth diameter being superior to the third diameter.

5. A method according to claim 4, wherein step (h) comprises filling the opening with a conductive material to form the second conductive member having an enlarged head of said fourth diameter and having an upper surface substantially coplanar with the upper surface of the second electrically insulating layer.

6. A method according to claim 5, wherein step (i) comprises providing a second horizontal electrically conductive layer of a width less than the diameter of said enlarged head so as to ensure that the entire width of the second horizontal electrically conductive layer is in electrical contact with the second conductive member.

7. A method according to claim 6, wherein the width of the second horizontal electrically conductive layer is reduced, and thus the need for any enlarged regions therein above the enlarged head can be avoided.

8. A method according to claim 1 wherein step c) further comprises the following steps:

applying a photosensitive material to the upper surface of the first electrically insulating layer;

photolithographically defining at least one hole in the photosensitive material exposing a portion of the first electrically insulating layer in a location where the contact hole is to be formed;

retaining the photosensitive material with its hole after the isotropically etching step for use in defining the substantially vertical hole during the anisotropically etching step; and removing the photosensitive material.

9. A method according to claim 1 wherein the step d) comprises the steps of:

filling the contact hole including the excavation, and covering the adjacent upper surface of the first electrically insulating layer, with an electrically conductive material to a thickness sufficient to ensure that the excavation is filled to at least the level of the upper surface of the first electrically insulating layer; and applying a polishing step to remove the conductive material above the level of the adjacent upper surface of the first electrically insulating layer, to form upper surfaces of the first conductive members substantially coplanar with the adjacent upper surface of the first electrically insulating layer.

10. A method according to claim 1 further comprising, between steps e) and g), the step:

f) isotropically etching the second electrically insulating layer in order to provide an excavation of a fourth diameter, penetrating only an upper portion of the second electrically isolating layer, the fourth diameter being superior to the third diameter.

11. A method for making contact structures in an integrated circuit comprising the steps of:

a) providing at least a portion of a first horizontal conductive or semiconductive layer;

b) providing a first electrically insulating layer over the first horizontal conductive or semiconductive layer;

c) in a location chosen for the formation of a contact structure:

etching the first electrically insulating layer through the first electrically insulating layer to expose a part of the first horizontal conductive or semiconductive layer;

d) filling the contact hole with a conductive material in order to provide a first conductive member in electrical contact with the part of the first horizontal conductive or -semiconductive layer, and having an upper surface substantially coplanar with an upper surface of the first electrically insulating layer;

e) applying a second electrically insulating layer over the upper surfaces of the first conductive member and the first electrically insulating layer;

f) isotopically etching the second electrically insulating layer in order to provide an excavation of a fourth diameter, penetrating only an upper portion of the second electrically isolating layer;

g) etching an opening through the second electrically insulating layer in order to expose a portion of the upper surface of the first conductive member;

h) filling the opening through the second electrically insulating layer with a conductive material in order to form a second conductive member having an enlarged head of said fourth diameter and having an upper surface substantially coplanar with the upper surface of the second electrically insulating layer; and i) portion of a second horizontal electrically conductive layer in electrical contact with an upper surface of the second conductive member.

12. A method according to claim 11 wherein step c) includes:

isotropically etching the first electrically insulating layer in order to provide an excavation of a first diameter penetrating only an upper portion of the first electrically insulating layer; and anisotropically etching, concentrically with the excavation, a substantially vertical hole of a second diameter through the first electrically insulating layer to expose a part of the first horizontal conductive or semiconductive layer; the second diameter being inferior to the first diameter.

13. A method according to claim 12 wherein the opening is a substantially vertical hole of a third diameter, inferior to the first diameter.

14. A method according to claim 12 wherein step c) further comprises the following steps:

applying a photosensitive material to the upper surface of the first electrically insulating layer;

photolithographically defining at least one hole in the photosensitive material exposing a portion of the first electrically insulating layer in a location where the contact hole is to be formed;

retaining the photosensitive material with its hole after the isotopically etching step for use in defining the substantially vertical hole during the anisotropically etching step; and removing the photosensitive material.

15. A method according to claim 12 wherein the step d) comprises the steps of:

filling the contact hole including the excavation, and covering the adjacent upper surface of the first electrically insulating layer, with an electrically conductive material to a thickness sufficient to ensure that the excavation is filled to at least the level of the upper surface of the first electrically insulating layer; and applying a polishing step to remove the conductive material above the level of the adjacent upper surface of the first electrically insulating layer, to form upper surfaces of the first conductive members substantially coplanar with the adjacent upper surface of the first electrically insulating layer.

* * * * *